United States Patent
Yoon et al.

(10) Patent No.: US 10,698,037 B2
(45) Date of Patent: Jun. 30, 2020

(54) SENSING CIRCUIT FOR BATTERY CELL VOLTAGE

(71) Applicants: Hyundai Motor Company, Seoul (KR); Kia Motors Corporation, Seoul (KR)

(72) Inventors: Jong Hu Yoon, Anyang-si (KR); Mi Ok Kim, Seongnam-si (KR); Beom Gyu Kim, Hwaseong-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 78 days.

(21) Appl. No.: 16/009,494

(22) Filed: Jun. 15, 2018

(65) Prior Publication Data

US 2019/0187215 A1    Jun. 20, 2019

(30) Foreign Application Priority Data

Dec. 18, 2017    (KR) .......................... 10-2017-0173805

(51) Int. Cl.
| | |
|---|---|
| *G01R 31/396* | (2019.01) |
| *G01R 31/36* | (2020.01) |
| *G01R 31/3835* | (2019.01) |
| *H02J 7/00* | (2006.01) |
| *H02J 7/34* | (2006.01) |

(52) U.S. Cl.
CPC ....... *G01R 31/396* (2019.01); *G01R 31/3644* (2013.01); *G01R 31/3835* (2019.01); *H02J 7/0021* (2013.01); *H02J 7/345* (2013.01)

(58) Field of Classification Search
CPC .............. G01R 31/396; G01R 31/3644; G01R 31/3835; H02J 7/0021; H02J 7/345
USPC ........................................................ 320/116
See application file for complete search history.

(56) References Cited

U.S. PATENT DOCUMENTS

| | | | | |
|---|---|---|---|---|
| 5,705,914 | A * | 1/1998 | Morita ................. | B60L 3/0023 340/636.17 |
| 5,867,097 | A * | 2/1999 | Jung ...................... | G08B 13/22 340/531 |
| 6,268,710 | B1 | 7/2001 | Koga | |
| 6,563,291 | B2 * | 5/2003 | Tamura ................. | H02J 7/0026 320/116 |
| 7,638,977 | B2 * | 12/2009 | Park .................... | H01M 10/482 320/136 |
| 8,350,519 | B2 * | 1/2013 | Brantner ............... | H02J 7/0032 320/101 |

(Continued)

FOREIGN PATENT DOCUMENTS

| | | |
|---|---|---|
| JP | 2000-088898 A | 3/2000 |
| JP | 2003-084015 A | 3/2003 |

(Continued)

*Primary Examiner* — M Baye Diao
(74) *Attorney, Agent, or Firm* — Morgan, Lewis & Bockius LLP

(57) ABSTRACT

A sensing circuit for battery cell voltage may include a first cell module including a plurality of battery cells; a first sensor sensing voltage of each battery cell of the first cell module; and a first isolation relay device including a plurality of relays, determining an electrical connection state between each battery cell of the first cell module and the first sensor by being connected thereto, and maintaining isolation between the first cell module and the first sensor.

11 Claims, 2 Drawing Sheets

(56) References Cited

U.S. PATENT DOCUMENTS

| | | | |
|---|---|---|---|
| 8,629,581 B2* | 1/2014 | Rutkowski | H01M 10/4207 |
| | | | 307/125 |
| 8,988,078 B2* | 3/2015 | Kiuchi | H01M 10/48 |
| | | | 324/434 |
| 9,669,723 B2* | 6/2017 | Sugeno | B60L 50/60 |
| 9,954,378 B2* | 4/2018 | Kobayashi | H02J 7/0014 |
| 2006/0192529 A1 | 8/2006 | Kimura et al. | |
| 2010/0079108 A1 | 4/2010 | Monden et al. | |
| 2013/0026994 A1* | 1/2013 | Morikawa | G01R 31/396 |
| | | | 320/134 |
| 2013/0176401 A1* | 7/2013 | Monari | H04N 5/232 |
| | | | 348/47 |

FOREIGN PATENT DOCUMENTS

| | | |
|---|---|---|
| JP | 3993397 B2 | 10/2007 |
| JP | 2011-223722 A | 11/2011 |
| KR | 10-1227835 B1 | 2/2013 |
| KR | 2014-0073948 A | 6/2014 |

* cited by examiner

SENSING CIRCUIT FOR BATTERY CELL VOLTAGE

CROSS REFERENCE TO RELATED APPLICATION

The present application claims priority to Korean Patent Application No. 10-2017-0173805, filed Dec. 18, 2017, the entire contents of which is incorporated herein for all purposes by this reference.

BACKGROUND OF THE INVENTION

Field of the Invention

The present invention relates generally to a sensing circuit for battery cell voltage. More particularly, the present invention relates to a sensing circuit for battery cell voltage which is configured to secure robustness of a circuit by optimizing a circuit configuration due to the solving of problems arising from an increase in the number of modules and ground isolation and to reduce costs through a reduction in the number of elements.

Description of Related Art

Having been developed into an integrated system structure in which a high voltage battery and a 12V lithium battery are integrated, a battery management system (BMS) performs a sensing operation by integrating a high voltage sensing circuit with a 12V lithium battery module (four cells/module structure).

12V lithium battery modules are different in capacities depending on small/medium/large batteries like plumbic acid batteries according to types of vehicles and, in a response to this, currently, a 12V and 12 Ah module including four lithium battery cells, being designed through standardization/communization, is used in parallel connection.

A 12V module may include four cells, and when two modules are connected in parallel, +/− terminals of each module may be connected correspondingly by busbars, but intermediate cells are unable to be connected by busbars.

To confirm a state of charge (SOC) or a degradation state depending on characteristics of each individual lithium battery cell, measuring a cell voltage is necessary individually. Accordingly, the 12V lithium battery sensing circuit needs a four cell sensing circuit in the case of one module and an eight cell sensing circuit in the case of two modules. Accordingly, as the number of parallel modules increases, elements necessary to compose a BMS circuit are also increased, whereby cost is increased.

Furthermore, in the case of the 12V lithium battery, an isolation design which is applicable to a high voltage battery is not necessarily applied. However, in the case of a BMS controller in a 12V lithium battery integrated system, sensing of the high voltage battery and a vehicle load (a relay, etc.) and sensing of the 12V lithium battery may be implemented at the same time. Due to the provided configuration, in the case of the BMS which used a battery voltage sensing line, a ground (GND) of the 12V lithium battery, and a vehicle chassis GND at the same time, an overcurrent entered internal to a BMS circuit from the outside thereof when a GND was disconnected. Consequentially, there was a problem that a hardware circuit of the BMS was damaged.

Accordingly, there was a necessity to find a solution being able to secure robustness of the circuit by optimizing circuit configuration due to the solving of problems arising from an increase in the number of modules and ground isolation and to reduce costs through a reduction in the number of elements.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a detecting circuit for battery cell voltage which is able to secure robustness of a circuit by optimizing circuit configuration due to the solving of problems arising from an increase in the number of modules and ground isolation and to reduce costs through a reduction in the number of elements.

In various aspects of the present invention, there is provided a sensing circuit for battery cell voltage, the sensing circuit including: a first cell module including a plurality of battery cells; a first sensor sensing voltage of each battery cell of the first cell module; and a first isolation relay device including a plurality of relays, determining an electrical connection state between each battery cell of the first cell module and the first sensor by being connected thereto, and maintaining isolation between the first cell module and the first sensor.

The sensing circuit for battery cell voltage may further include: a second cell module including a plurality of battery cells and being connected in parallel with the first cell module; a second sensor sensing voltage of each battery cell of the second cell module; and a second isolation relay device including a plurality of relays, determining an electrical connection state between each battery cell of the second cell module and the second sensor by being connected thereto, and maintaining isolation between the second cell module and the second sensor.

Each of the plurality of relays of the first isolation relay device and the second isolation relay device may be a PhotoMOS relay.

The detecting circuit for battery cell voltage may include: a first cell module including a plurality of battery cells connected together in series; a second cell module including a plurality of battery cells connected together in series, the second cell module being connected in parallel with the first cell module; a sensor sensing voltage of each battery cell of the first cell module and the second cell module; and a common relay device including a plurality of relays, determining an electrical connection state and maintaining isolation between an uppermost battery cell terminal of the first cell module and the second cell module and the sensor, and between a lowermost battery cell terminal of the first cell module and the second cell module and the sensor by being connected thereto.

The sensing circuit for battery cell voltage may further include: an isolation relay device including a plurality of relays, and determining an electrical connection state and maintaining isolation between terminals, other than the uppermost battery cell terminal and the lowermost battery cell terminal of the first cell module and the second cell module, and the sensor by being connected thereto.

Each of the plurality of relays of the common relay device and the isolation relay device may be a PhotoMOS relay.

The sensor may include: a charging portion charged with current from a cell of the first cell module and the second cell module; a discharging portion discharging voltage charged in the charging part; and a measuring portion measuring cell voltage through voltage charged in the charging part.

According to a sensing circuit for battery cell voltage of the present invention, robustness of a circuit may be secured by optimizing circuit configuration due to the solving of problems arising from an increase in the number of modules and ground isolation, and costs may be saved through a reduction in the number of elements.

Furthermore, by minimizing the increase in the number of elements due to the increase in the number of the modules, space necessary for circuit design may be minimized, and an increase in sizes of PCB, controllers, and the like may be minimized.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
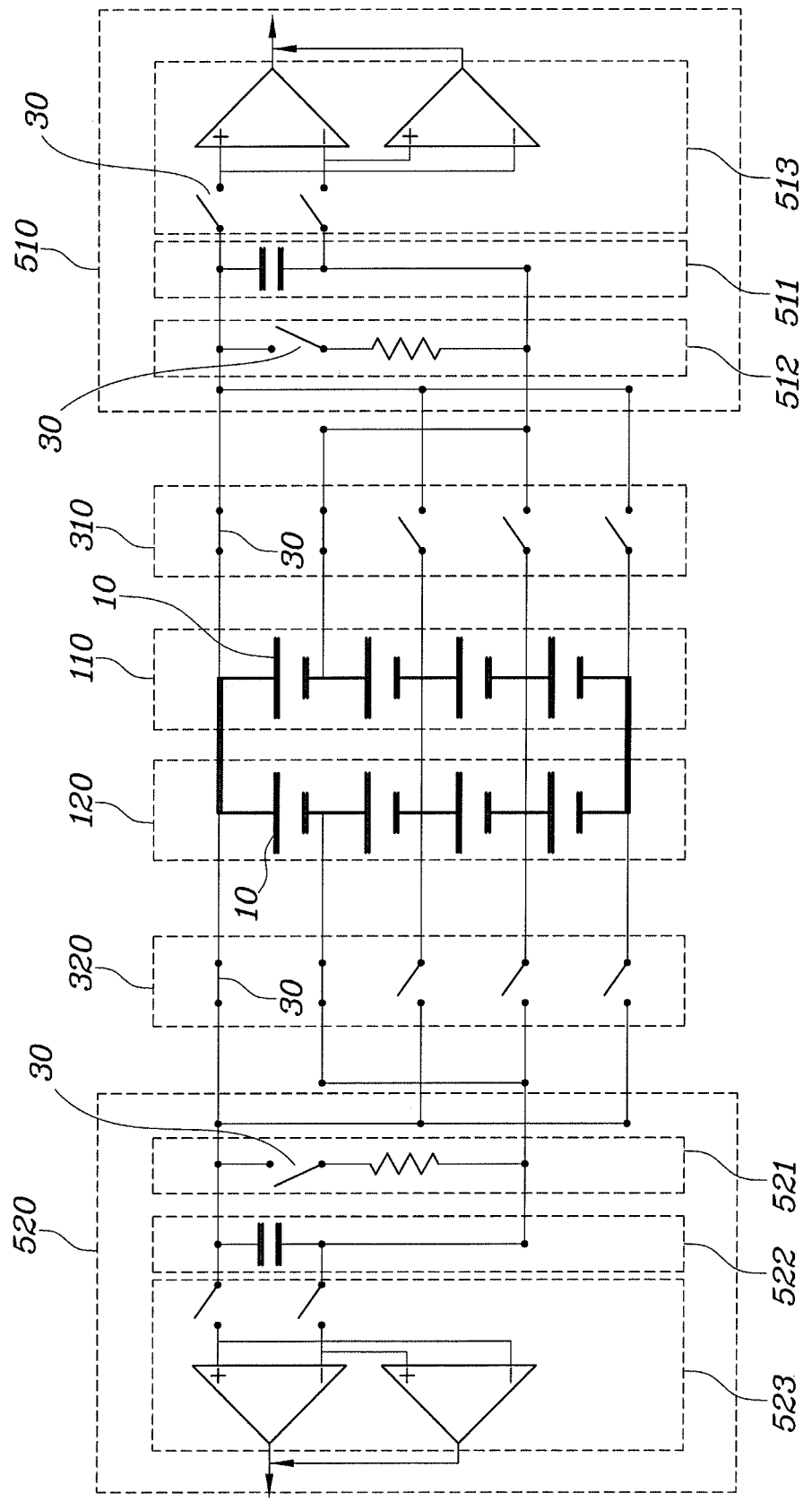
FIG. 1 is a block diagram of a sensing circuit for battery cell voltage according to various exemplary embodiments of the present invention.

It may be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Hereinafter, a sensing circuit for battery cell voltage according to various types of embodiments with reference to the accompanying drawings. Throughout the drawings, the same reference numerals will refer to the same or like parts.

Figure 2:
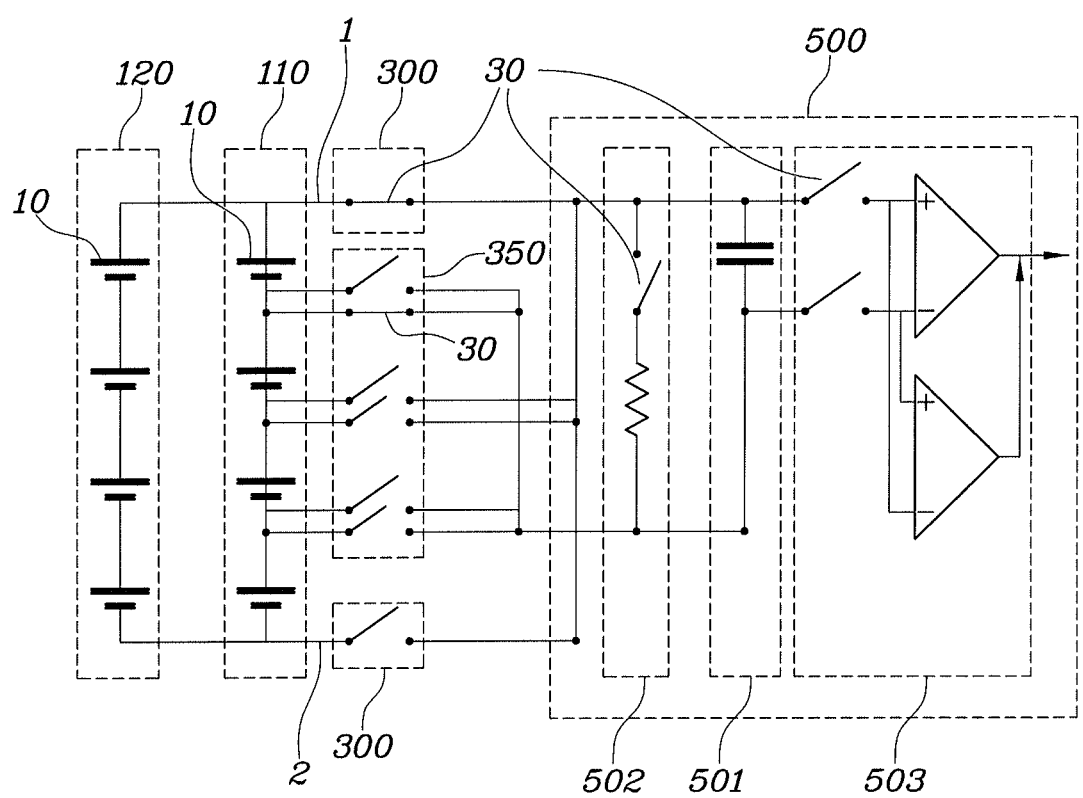
FIG. 2 is a block diagram of a sensing circuit for battery cell voltage according to various exemplary embodiments of the present invention.

FIG. 1 is a block diagram of a sensing circuit for battery cell voltage according to various exemplary embodiments of the present invention and FIG. 2 is a block diagram of a sensing circuit for battery cell voltage according to various exemplary embodiments of the present invention.

First, referring to FIG. 1, the sensing circuit for battery cell voltage according to the various exemplary embodiments of the present invention may include: a first cell module 110 including a plurality of battery cells 10; a first sensor 510 sensing voltage of each battery cell 10 of the first cell module 110; and a first isolation relay device 310 including a plurality of relays 30, determining an electrical connection state between each battery cell 10 of the first cell module 110 and the first sensor 510 by being connected thereto, respectively, and maintaining isolation between the first cell module 110 and the first sensor 510.

In an exemplary embodiment of the present invention, the first cell module 110 may be configured as one module by connecting a plurality of 12V lithium battery cells 10 together in series.

The first sensor 510 may include a charging portion 511, a discharging portion 512, and a measuring portion 513.

Here, the charging portion 511 may include a capacitor, and the capacitor is charged with current from a cell included in the first cell module 110 by control of the first isolation relay device 310. The discharging portion 512 is a circuit having a resetting function discharging voltage charged in the charging portion 511 or a circuit for cell balancing. The measuring portion 513 may include an op-amp to materialize a comparator detecting voltage of both end portions of the capacitor, PhotoMOS relays to short/open electrically a space between both end portions of the capacitor and corresponding input terminals of the comparator, an A/D converter, and the like, and the cell voltage is measured through voltage charged in the charging portion 511, which is the capacitor.

Relays included in the first isolation relay device 310 and the measuring portion 513 may be complementarily controlled each other. For example, when the capacitor of the charging portion 511 is charged with the cell voltage, during some of the relays belonged to the first isolation relay device 310 enter a short state, relays included in the measuring portion 513 are maintained in an open state. Further. Furthermore, during relays included in the measuring portion 513 are maintained in a short state to measure voltage charged in the capacitor of the charging portion 511, all relays included in the first isolation relay device 310 enter an open state. Through the operation of such relays included in the first isolation relay device 310 and the measuring portion 513, isolation state between a battery side and a controller side may be maintained. Through the maintenance of such an isolation state, even when an abnormal situation such as an inflow of an external overcurrent occurs, a robust design of the circuit becomes possible without requiring additional isolated communications element.

Relays included in the first isolation relay device 310 and the measuring portion 513 may be a PhotoMOS relays. By detecting through application of a PhotoMOS relay element, reliability may be enhanced in terms of circuit robustness.

Meanwhile, as illustrated in FIG. 1, the sensing circuit for battery cell voltage according to the various exemplary embodiments of the present invention may further include, besides the first cell module 110, the first sensor 510, and the first isolation relay device 310, a second cell module 120 including a plurality of battery cells 10 and being connected in parallel with the first cell module 110; a second sensor 520 detecting voltage of each battery cell 10 of the second cell module 120; and a second isolation relay device 320 including a plurality of relays 30, determining an electrical connection state between each battery cell 10 of the second cell module 120 and the second sensor 520 by being connected thereto, respectively, and maintaining isolation between the second cell module 120 and the second sensor 520.

In the same manner as that described for the first cell module 110, the second cell module 120 may be configured as one module by connecting a plurality of 12V lithium battery cells 10 together in series.

The second sensor 520, the same as the first sensor 510, may include a charging portion 521, a discharging portion 522, and a measuring portion 523. As functions and operation of the charging portion 521, the discharging portion 522, and the measuring portion 523 are the same as functions and operation of the charging portion 511, the discharging portion 512, and the measuring portion 513, respectively, description thereof is omitted.

The configuration of the second isolation relay device 320 and the second sensor 520 remains the same as that described for the first isolation relay device 310 and the first sensor 510. Accordingly, in the same way as described earlier, by accomplishing isolation between the battery side and the controller side by the second isolation relay device 320 and the second sensor 520, when an abnormal situation such as an inflow of an external overcurrent occurs, a robust design of the circuit becomes possible without requiring additional isolated communications element. Furthermore, by detecting through adoption of a PhotoMOS relay element, reliability is high in terms of circuit robustness.

Referring to FIG. 2, a two module sensing circuit for battery cell voltage according to various exemplary embodiments of the present invention may include: a first cell module 110 including a plurality of battery cells 10 connected together in series; a second cell module 120 including a plurality of battery cells 10 connected together in series and being connected in parallel with the first cell module 110; a sensor 500 sensing voltage of each battery cell 10 of the first cell module 110 and the second cell module 120; and a common relay device 300 including a plurality of relays 30, determining an electrical connection state and maintaining isolation between the uppermost battery cell terminal 1 of the first cell module 110 and the second cell module 120 and the sensor 500, and the lowermost battery cell terminal 2 of the first cell module 110 and the second cell module 120 and the sensor 500 by being connected thereto, respectively.

As the first cell module 110 and the second cell module 120 of the present exemplary embodiments are identical with the first cell module 110 and the second cell module 120 described in the above-mentioned exemplary embodiments of the present invention, respectively, description of functions and operation thereof is omitted.

The sensor 500 is a sensing circuit integrating the first sensor 510 and the second sensor 520 of the above-mentioned exemplary embodiments of the present invention, and detects voltage of each battery cell of the first cell module 110 and the second cell module 120. A sensing sequence is sensing the second cell module 120 after sensing the first cell module 110, in order. The sensor 500 may include a charging portion 501, a discharging portion 502, and a measuring portion 503, all of which are identical with the charging parts 511 and 521, the discharging parts 512 and 522, and the measuring parts 513 and 523 of the above-mentioned exemplary embodiments of the present invention, respectively, so description of functions and operation thereof is omitted.

The common relay device 300 forms an integrated two module structure by being connected to the uppermost battery cell terminal 1 of the first cell module 110 and the second cell module 120 and the sensor 500, and the lowermost battery cell terminal 2 of the first cell module 110 and the second cell module 120 and the sensor 500, respectively. That is, an integrated two module structure is formed in which the uppermost sensing line and the lowermost sensing line of the two modules are used in common. On this wise, through a commonization design of the uppermost/lowermost sensing line, reduction in the number and size of connector pins is possible. Relating to operation of sensing, though the uppermost/lowermost sensing line is common, sensing function is actuated normally since the sensing proceeds in order.

An isolation relay device 350 determines an electrical connection state between each terminal other than the uppermost battery cell terminal 1 and the lowermost battery cell terminal 2 and the sensor 500 by being connected thereto.

Similar to the operation of the relays included in the first isolation relay device 310 and the measuring portion 513 shown in FIG. 1, in the exemplary embodiment illustrated in FIG. 2, a plurality of relays of a common relay device 300 and an isolation relay device 350 and relays belonged to a measuring portion 503 may be complementarily controlled each other. For example, when the capacitor of the charging portion 501 is charged with the cell voltage, during some of the relays belonged to a plurality of relays of the common device 300 and the isolation relay device 350 enters a short state, the relays included in the measuring portion 503 are maintained in an open state. Furthermore, when the relays included in the measuring portion 503 are maintained in a short state to measure voltage charged in the capacitor of the charging portion 501, all of the plurality of relays included in the common device 300 and the isolation relay device 350 enter an open state. Isolation state between a battery side and a controller side may be maintained through the operation of the plurality of relays of the common device 300 and the isolation relay device 350 and the relays included in the measuring portion 503. Through the maintenance of such an isolation state, even when an abnormal situation such as an inflow of an external overcurrent occurs, a robust design of the circuit becomes possible without requiring additional isolated communications elements.

Furthermore, being applied a PhotoMOS relay element, a plurality of relays of the common device 300 and the isolation relay device 350 has high reliability in terms of circuit robustness.

Furthermore, by allowing the two module sensing circuit to be integrated through the common device 300 and the sensor 500, an increased amount of material cost related to a circuit/PCB/apparatus according to an increase in the number of modules may be minimized. Further. Furthermore, an increase in sizes of a PCB, controllers, and the like may be minimized by minimizing space necessary for circuit design.

For convenience in explanation and accurate definition in the appended claims, the terms "upper", "lower", "internal", "outer", "up", "down", "upper", "lower", "upwards", "downwards", "front", "rear", "back", "inside", "outside", "inwardly", "outwardly", "internal", "external", "internal", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described to explain certain principles of the invention and their practical application, to enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A sensing circuit for battery cell voltage, the sensing circuit comprising:
   a first cell module including a plurality of battery cells;
   a first sensor sensing voltage of each battery cell of the first cell module; and
   a first isolation relay device including a plurality of relays, selectively determining an electrical connection state between each battery cell of the first cell module and the first sensor by being connected thereto, and selectively maintaining isolation between the first cell module and the first sensor,
   wherein the first sensor includes:
      a charging portion having a capacitor charged with current from a cell among the plurality of battery cells included in the first cell module by operation of the first isolation relay device;
      a measuring portion having a comparator detecting voltage being input from first and second end portions of the capacitor, and relays to short or open electrically a space between the first and second end portions of the capacitor and corresponding input terminals of the comparator, and
   wherein, when the capacitor is charged by operation of the relays included in the first isolation relay device, the relays included in the measuring portion are maintained in an open state, and when the relays included in the measuring portion enters a short state to receive voltage of the first and second end portions of the capacitor, the relays included in the first isolation relay device enters an open state.

2. The sensing circuit of claim 1, further including:
   a second cell module including a plurality of battery cells and being connected in parallel to the first cell module;
   a second sensor sensing voltage of each battery cell of the second cell module; and
   a second isolation relay device including a plurality of relays, selectively determining an electrical connection state between each battery cell of the second cell module and the second sensor by being connected thereto, and selectively maintaining isolation between the second cell module and the second sensor.

3. The sensing circuit of claim 2, wherein each of the plurality of relays of the first isolation relay device and the second isolation relay device is a PhotoMOS relay.

4. The sensing circuit of claim 1, wherein the first sensor further includes:
   a discharging portion selectively connected to the charging portion to discharge a voltage charged in the charging portion.

5. The sensing circuit of claim 2, wherein the second sensor includes:
   a charging portion having a capacitor charged with current from a cell among the plurality of battery cells included in the second cell module by operation of the second isolation relay device;
   a measuring portion having a comparator detecting voltage being input from first and second end portions of the capacitor of the second sensor, and relays to short or open electrically a space between the first and second end portions of the capacitor of the second sensor and corresponding input terminals of the comparator of the second sensor,
   wherein, when the capacitor of the second sensor is charged by operation of the relays included the second isolation relay device, the relays included in the measuring portion of the second sensor are maintained in an open state, and when the relays included in the measuring portion of the second sensor enters a short state to receive voltage of the first and second end portions of the capacitor of the second sensor, the relays included in the second isolation relay device enters an open state.

6. The sensing circuit of claim 5, wherein the second sensor further includes:
   a discharging portion selectively connected to the charging portion to discharge a voltage charged in the charging portion.

7. A sensing circuit for battery cell voltage, the sensing circuit comprising:
   a first cell module including a plurality of battery cells connected together in series;
   a second cell module including a plurality of battery cells connected together in series, the second cell module being connected in parallel with the first cell module;
   a sensor sensing voltage of each battery cell of the first cell module and the second cell module; and
   a common relay device including a plurality of relays, and selectively determining an electrical connection state and maintaining isolation between an uppermost battery cell terminal of the first cell module and the second cell module and the sensor, and between a lowermost battery cell terminal of the first cell module and the second cell module and the sensor by being selectively connected between the uppermost battery cell terminal of the first cell module and the second cell module and the sensor, and between the lowermost battery cell terminal of the first cell module and the second cell module and the sensor.

8. The sensing circuit of claim 7, further including:
   an isolation relay device including a plurality of relays, and selectively determining an electrical connection state and maintaining isolation between terminals of the first cell module, except the uppermost battery cell terminal and the lowermost battery cell terminal of the first cell module and the second cell module, and the sensor by being selectively connected thereto.

9. The sensing circuit of claim 8, wherein each of the plurality of relays of the common relay device and the isolation relay device is a PhotoMOS relay.

10. The sensing circuit of claim 7, wherein the sensor includes:
   a charging portion having a capacitor charged with current from a cell among the plurality of battery cells of the first cell module and among the plurality of battery cells of the second cell module by operation of the common relay device and the isolation relay device; and
   a measuring portion having a comparator detecting voltage being input from first and second end portions of the capacitor, and relays to short or open electrically a space between the first and second end portions of the capacitor and corresponding input terminals of the comparator,
   wherein, when the capacitor is charged by operation of the relays included in the common relay device and the isolation relay device, the relays included in the measuring portion are maintained in an open state, and when the relays included in the measuring portion enters a short state to receive voltage of the first and second end portions of the capacitor, the relays included in the common relay device and the isolation relay device enters an open state.

11. The sensing circuit of claim 10 wherein the sensor further includes:
   a discharging portion selectively connected to the charging portion to discharge a voltage charged in the charging portion.

* * * * *